(12) United States Patent
Fujimoto

(10) Patent No.: US 6,517,982 B2
(45) Date of Patent: Feb. 11, 2003

(54) MASK SET FOR USE IN PHASE SHIFT PHOTOLITHOGRAPHY TECHNIQUE WHICH IS SUITABLE TO FORM RANDOM PATTERNS, AND METHOD OF EXPOSURE PROCESS USING THE SAME

(75) Inventor: Masashi Fujimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 13 days.

(21) Appl. No.: 09/741,375

(22) Filed: Dec. 21, 2000

(65) Prior Publication Data

US 2001/0005565 A1 Jun. 28, 2001

(30) Foreign Application Priority Data

Dec. 24, 1999 (JP) .......................................... 10-368228

(51) Int. Cl.[7] .............................. G03C 5/00; G03F 9/00
(52) U.S. Cl. ............................ 430/22; 430/5; 430/394; 430/312; 430/322; 430/396
(58) Field of Search .............................. 430/5, 22, 394, 430/322, 313, 312, 396

(56) References Cited

U.S. PATENT DOCUMENTS 5,308,741 A * 5/1994 Kemp ......................... 430/312
5,523,186 A * 6/1996 Lin et al. ....................... 430/5
5,858,580 A * 1/1999 Wang et al. ................... 430/5

FOREIGN PATENT DOCUMENTS

| JP | 4-337732 | 11/1992 |
| JP | 5-165191 | 6/1993 |
| JP | 5-273739 | 10/1993 |
| JP | 10-232482 | 9/1998 |

* cited by examiner

Primary Examiner—Christopher G. Young
Assistant Examiner—Saleha R. Mohamedulla
(74) Attorney, Agent, or Firm—Young & Thompson

(57) ABSTRACT

A method of forming a photoresist pattern by a photolithography technique is composed of:
  providing a photoresist layer;
  exposing the photoresist layer to a first pattern-defining light using a first mask; and
  exposing the photoresist layer to a second pattern-defining light using a second mask. The first mask includes a shielding region shielding the first pattern-defining light. The second mask includes a phase-shifting region having a phase shifter edge and a non-phase-shifting region adjacent to the phase-shifting region on the phase shifter edge. A first light portion of the second pattern-defining light passes through the phase-shifting region. A second light portion of the second pattern-defining light passes through the non-phase-shifting region. A first phase of the first light portion differs from a second phase of the second light portion. The first and second masks are aligned such that the phase shifter edge overlaps on the shielding region.

6 Claims, 16 Drawing Sheets

Fig. 2A PRIOR ART
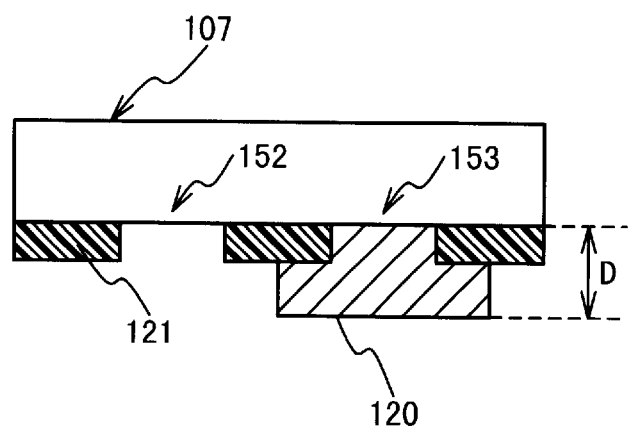
Fig. 2B PRIOR ART
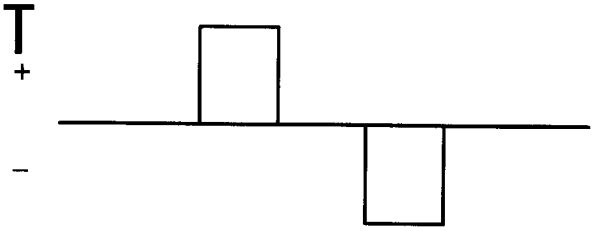
Fig. 2C PRIOR ART
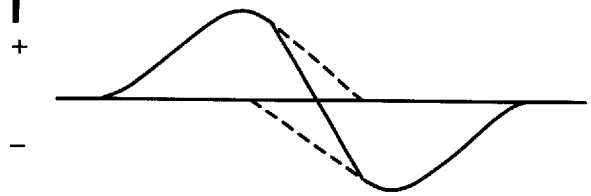
Fig. 2D PRIOR ART

B-B'

MASK SET FOR USE IN PHASE SHIFT PHOTOLITHOGRAPHY TECHNIQUE WHICH IS SUITABLE TO FORM RANDOM PATTERNS, AND METHOD OF EXPOSURE PROCESS USING THE SAME

BACKGROUND OF THE INVENTION

1. Field of the Invention

This invention relates to an exposure method for use in photolithography and a mask for use in photolithography. More particularly, the invention relates to a phase-shift mask and an exposure method using the phase-shift mask.

2. Description of the Related Art

To form patterns of semiconductor elements, a photolithography technique is commonly employed. A pattern of a mask is transferred to a photosensitive resin layer provided on a semiconductor substrate by the photolithography technique. The photosensitive resin is also known as "resist." A resist is classified into two type, i.e., negative type and positive type. The negative-type resist is of the type; any part of which that has been exposed to the light applied through a mask will remain on the semiconductor substrate. The positive-type resist is of the type; any part of which that has been exposed to the light applied through a mask will be removed from the semiconductor substrate.

In recent years, it has been demanded that an image be formed on a resist layer in higher resolution to provide fine patterns of semiconductor elements. Fine semiconductor element patterns increase integration density of a semiconductor integrated circuit.

To enhance the resolution of an image formed on a resist, a phase shift exposure method is proposed in 1982. In the phase shift exposure method, the phase difference between light beams applied is utilized to improve the resolution of the image focused on a resist layer. The principle of the phase shift exposure will be described, with reference to FIGS. 1A to 1D and FIGS. 2A to 2D.

In the ordinary exposure, the light applied perpendicularly to a mask 106 passes through the transparent regions 150 and 151 of the mask as illustrated in FIG. 1A. Chromium mask patterns 121 are provided on the mask 106. The mask 106 has transparent regions 150 and 151. The light beams passing through the transparent regions 150 and 151 have the same phase. The light beams emanate from the transparent regions 150 and 151 and pass through the projection lens of a reducing projection exposure apparatus. The two beams are then focused on the surface of a resist layer, which is on an image-forming surface.

The distance between the transparent regions 150 and 151 cannot be reduced to an infinitesimal value, for the following reason. If the distance is extremely short, the two beams passing the regions 150 and 151 overlaps at the image-forming surface as indicated by the broken lines in FIG. 1C. The light beams, which have a same phase, intensify each other at the image-forming surface. As a result, the light-intensity distribution on the surface of the resist has one peak as illustrated in solid line in FIG. 1D. Consequently, the chromium mask patterns 121 are not correctly transferred to the resist layer. Thus, the interval between the transparent regions 150 and 151 cannot be decreased over a certain limit. The limit R of resolution for any image formed on a resist is given as follows:

$$R = K_1 \times \lambda / NA \quad (1)$$

where $K_1$ is the constant that depends on the properties of the photosensitive resin, $\lambda$ is the wavelength of the light applied to the mask 106, and NA is the numerical aperture of the projection lens that is incorporated in the reducing projection exposure apparatus. Here, the limit R is known as "Reyleigh resolution".

In the phase shift exposure, light is applied to a resist layer through a phase shift mask 107 as is illustrated in FIG. 2A. The phase shift mask 107 has transparent regions 152 and 153. The region 153 is provided with a phase shifter 120, while the region 152 has no phase shifters. The light beam passing through the transparent region 153 is delayed as it passes through the phase shifter 120. Hence, the light beam passing through the transparent region 153 differs in phase from the light beam passing through the transparent region 152. The thickness D that the phase shifter should have to impart a phase difference of 180° to the light beams is given as follows:

$$D = \lambda / \{2 \times (n-1)\} \quad (2)$$

where $\lambda$ is the wavelength of the light applied to the phase shift mask 107, and n is the refractive index of the phase shifter 120. If the two light beams emanating from the transparent region 152 and the transparent region 153, respectively, have a phase difference of 180°, their parts overlapping at the image-forming surface will cancel out each other. As a result, as shown in FIG. 2C, the intensity of light is nil at one part of the surface of the resist layer. It follows that the light-intensity distribution on the resist has two peaks as shown in FIG. 2D. The chromium patterns 121 can therefore be transferred to the resist with high accuracy. Thus, the use of the phase shift mask 107 can enhance the resolution of an image focused on the surface of a resist.

Also, the phase shift exposure technique can increase the depth of focus (DOF). The term "depth of focus" means the range of distance over which the focus may be displaced without causing troubles. The reason is discussed comparing the ordinary exposure technique and the phase exposure technique in the following.

In the ordinary exposure using no phase shifters, the more the image-forming surface deviates from the focal plane, the more the two beam emanating from the transparent regions 150 and 151 overlap each other at the image-forming surface. This means that the resolution will sharply decrease if the image-forming surface of the resist deviates from the focal plane.

In the phase shift exposure, the two adjacent beams emanating from the transparent regions 152 and 153 have a phase difference of 180°. Their overlapping parts cancel out each other at the image-forming surface of the resist layer. The intensity of light is therefore zero at one part of the image-forming surface. Hence, even if defocusing occurs, that is, even if the focus deviates from the image-forming surface, the dimensional precision of the pattern, transferred to the resist, will be hardly influenced. Thus, the depth of focus can be increased in the phase shift exposure.

The phase shift exposure technique, however, cannot successfully apply to two-dimensional random patterns. The layout pattern of a semiconductor integrated circuit includes regular patterns and random patterns. Each regular pattern extends in one direction only, whereas each random pattern randomly extends first in one direction, and then in another direction. Here, examples of regular patterns are the bit lines and word lines of a DRAM (Dynamic Random Access Memory). Examples of random patterns are the wires of logic circuits. The phase shift masks are designed in accordance with the basic rule that a phase difference of 180° is imparted to two beams that have passed through two adjacent transparent regions. This basic rule can be easily applied to the regular patterns, but not to two-dimensional random patterns.

FIG. 3A is a plan view of a phase shift mask 108 that may be used to form two-dimensional random patterns by means of the conventional phase shift exposure. The phase-shift mask 108 is designed to transfer a pattern on a positive-type resist. The mask 108 has a shield region 111, a transparent region 113 and a transparent region 114. The shield region 111 is identical in shape to the pattern that is to be transferred to a resist. Phase shifters 120 are provided on the transparent region 113. The beam passing through the transparent region 113 is out of phase with respect to the beam passing through the transparent region 114. In other words, the phase of the beam differs by 180° from that of the beam passing through the transparent region 114. FIG. 3C is a sectional view of the Levenson-type mask 108, taken along line C—C in FIG. 3A. As FIG. 3C shows, the mask 108 is composed of a glass substrate 122. A chromium film 121 is provided on the shield region 111, and a phase shifter 120 is provided on the transparent region 113. No phase shifters are provided on the transparent region 114.

Light is applied to the positive-type resist through the phase-shift mask 108. Light-exposed parts of the positive-type resist are developed and resist patterns 117 are formed as shown in FIG. 3B. The shield region 111 shields the part 115 of the positive-type resist from the light. Thus, the part 115 of the resist, which opposes the shield region 111, is developed as is intended.

In addition, the part 116 of the resist layer, which opposes the boundaries between the transparent regions 113 and 114, is developed. The beams passing through the transparent region 113 (having a phase shifter) and the transparent region 114 (having no phase shifters) have the opposite phases. The intensity of light is therefore almost nil at the boundary between the transparent regions 113 and 114. The part 116 of the resist, which opposes the boundary between the transparent regions 113 and 114, is also developed. That is, not only the part 115 that should be developed, but also the parts 116 which should not be developed is developed.

With the conventional phase shift exposure it is difficult to prevent the part 116 of the resist layer from being developed. Hence, the conventional phase-shift mask 108 cannot be used to transfer two-dimensional random patterns to a positive-type resist.

It will be described now how two-dimensional random patterns are transferred to a negative-type resist by means of the conventional phase shift exposure technique. FIG. 4 is a plan view of a phase-shift mask 109 that is used to transfer two-dimensional random patterns to a negative-type resist. As shown in FIG. 4, the phase-shift mask 109 has a shield region 111', a transparent region 113' and a transparent region 114'. A phase shifter is provided on the shield region 111'. The transparent region 113 has phase shifters while the transparent region 114' has no phase shifters. The phase shifter imparts a phase different of 180° to the beam that has passed through the transparent region 113', with respect to the beam that has passed through the transparent region 114'.

The transparent region 113' is an auxiliary pattern for enhancing the resolution of the negative-type resist pattern that will be formed at a position corresponding to the transparent region 114'. Nonetheless, the transparent region 113' is required to have a width equal to or less than the value equivalent to the resolution limit. It is difficult to form transparent regions having such a small width at high reliability. Hence, the conventional phase shift exposure technique cannot process resists to form two-dimensional random patterns on negative-type resists.

As described above, the conventional phase shift exposure cannot be applied to transfer two-dimensional random patterns on positive-type resists or negative-type resists.

It is desired that images be formed on resists at resolution high enough to form two-dimensional random patterns.

It is also desired that two-dimensional random patterns of high precision be transferred to resists by means of phase shift exposure technique.

SUMMARY OF THE INVENTION

An object of the present invention is to form high-resolution images on resists in the process of forming two-dimensional random patterns.

Another object of the invention is to transfer two-dimensional random patterns of high precision to resists by means of phase shift exposure technique.

In order to achieve an aspect of the present invention, a method of forming a photoresist pattern by a photolithography technique is composed of:

providing a photoresist layer;

exposing the photoresist layer to a first pattern-defining light using a first mask; and exposing the photoresist layer to a second pattern-defining light using a second mask. The first mask includes a shielding region shielding the first pattern-defining light. The second mask includes a phase-shifting region having a phase shifter edge and a non-phase-shifting region adjacent to the phase-shifting region on the phase shifter edge. A first light portion of the second pattern-defining light passes through the phase-shifting region. A second light portion of the second pattern-defining light passes through the non-phase-shifting region. A first phase of the first light portion differs from a second phase of the second light portion. The first and second masks are aligned such that the phase shifter edge overlaps on the shielding region.

The shield region may include a line resist shielding portion to form a line resist pattern extending to a first direction. The line shielding portion has a centerline extending to the direction. In this case, it is desirable that the phase shifter edge substantially overlaps on the centerline when the first and second masks are aligned.

The phase shifter edge may be composed of first and second phase shifter edges parallel to each other and extending to the first direction. In this case, a distance between the first and second phase shifter edges is desirably larger than a width of the line shielding portion in a second direction perpendicular to the first direction.

The phase-shifting region may be provided with a phase-shifter layer. In this case, a thickness of the phase-shifter layer is desirably determined such that a phase difference between the first phase and the second phase ranges from 175 to 185°.

Also, the first pattern-defining light has a first intensity and the second pattern-defining light has a second intensity. In this case, the second intensity is desirably larger than the first intensity.

In order to achieve another aspect of the present invention, A mask set is composed of a first mask and second mask. The first mask includes a shielding region shielding a pattern-defining light exposed to the first mask. The second mask includes a phase-shifting region having a phase shifter edge and a non-phase-shifting region adjacent to the phase-shifting region in the phase shifter edge. A first phase of a first light passing through the phase-shifting region differs from a second phase of a second light passing through the non-phase-shifting region. The phase shifter edge overlaps on the shield region when the first and second masks are aligned.

BRIEF DESCRIPTION OF THE DRAWINGS

FIGS. 2A to 2D are diagrams for explaining a conventional phase shift exposure technique;

DESCRIPTION OF THE PREFERRED EMBODIMENTS

An exposure method according to an embodiment of the present invention will be described below, with reference to the accompanying drawings.

The exposure method according to the present embodiment includes the first exposure step and the second exposure step. The first exposure step is performed, using a chromium mask 1 shown in FIG. 5A. The second exposure step is performed, using a chromium-less phase shift mask 2 shown in FIG. 5B.

Figure 1A:
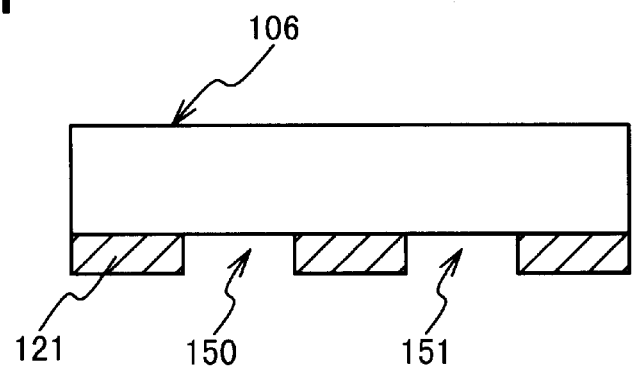
FIGS. 1A to 1D are diagrams explaining a conventional exposure technique.
Figure 1B:
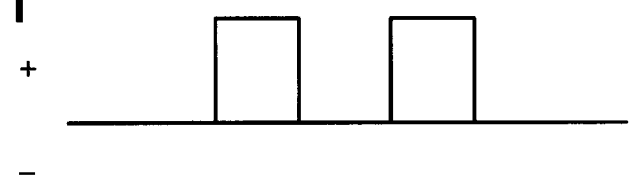
Figure 1C:
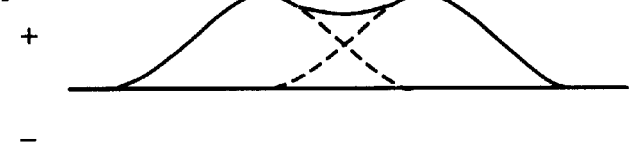
Figure 1D:
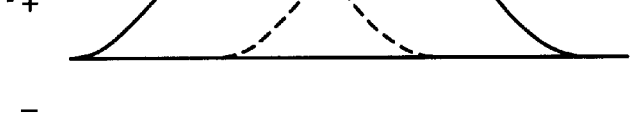
Figure 3A:
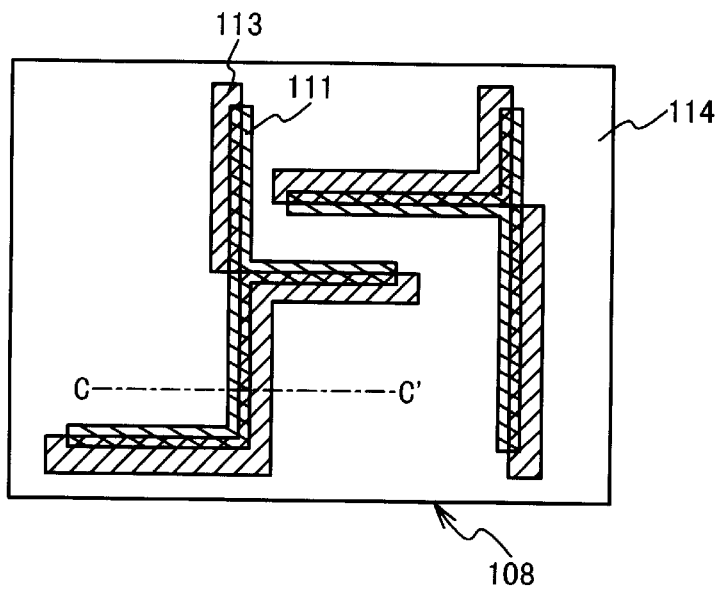
FIG. 3A is a plan view of a conventional Levenson-type mask that may be used to form two-dimensional random patterns.
Figure 3B:
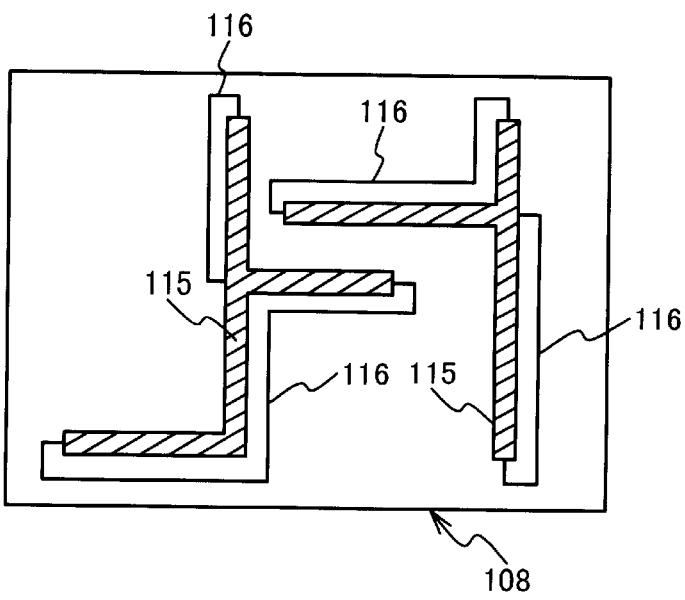
FIG. 3B is a diagram showing parts of a positive-type resist which are developed after exposed to light applied through the mask shown in FIG. 3A.
Figure 3C:
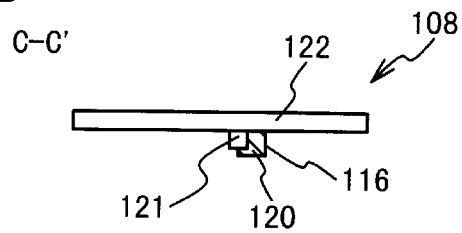
FIG. 3C is a sectional view of the conventional phase-shift mask 108.
Figure 4:
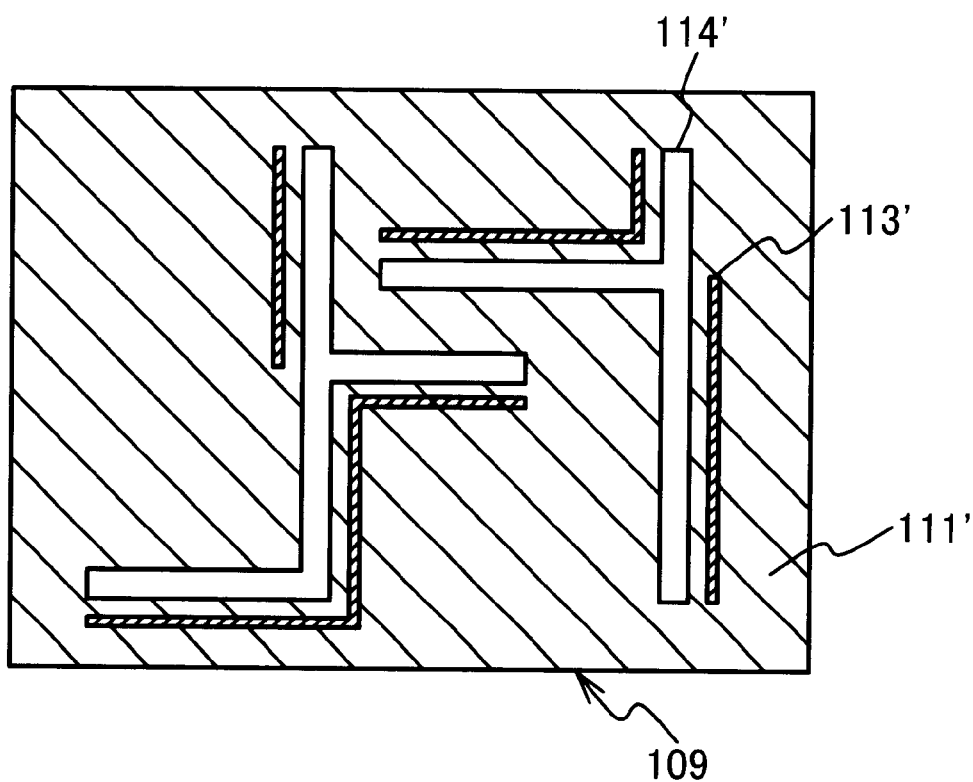
FIG. 4 is a plan view of another Levenson-type mask 109 that may be used to transfer two-dimensional random patterns.
Figure 5A:
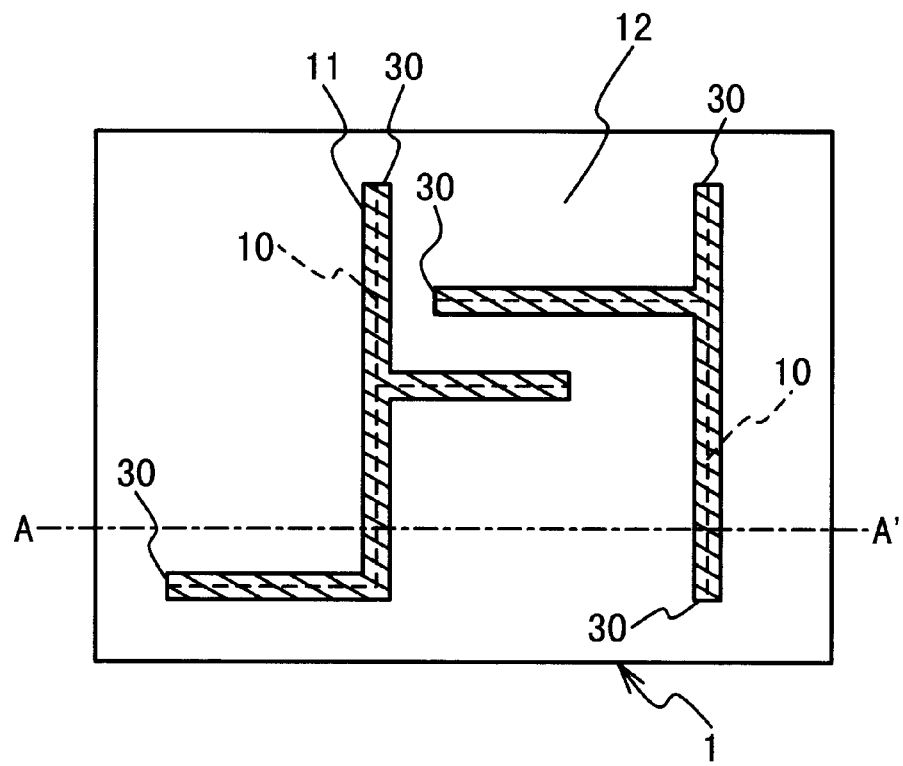
FIG. 5A is a plan view of a chromium mask 1 (i.e., a photo-mask) used in the first exposure step of the exposure method according to the invention.

As shown in FIG. 5A, the chromium mask 1 has a shield region 11 and a first transparent region 12. The shield region 11 defines a two-dimensional random pattern. The term "two-dimensional random pattern" means a pattern composed of lines irregularly arranged, not composed of lines that extend in vertical direction or horizontal direction, or both. In other words, a two-dimensional random pattern is one in which the interval between the constituent lines and/or the length of each constituent line is not regular in the vertical direction and/or the horizontal direction. The shield region 11 defining a two-dimensional random pattern has vertical lines and horizontal lines, each having a centerline 10. The shape of the shield 11 is determined based on the design values described in the layout data generated by means of CAD (Computer Aided Design).

Figure 5B:
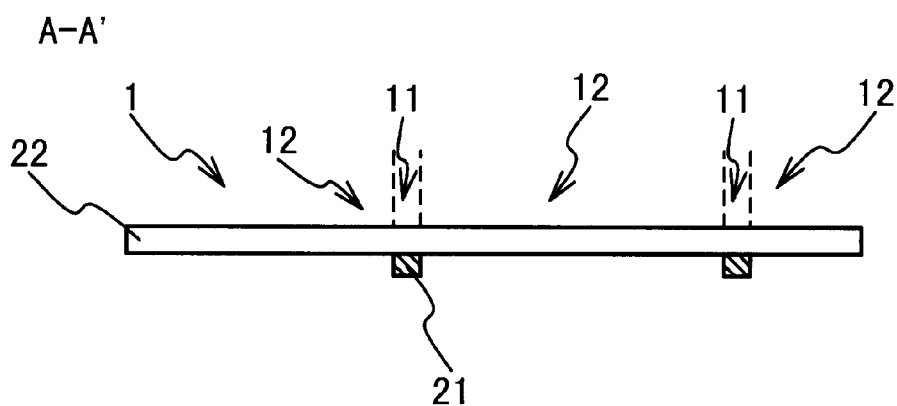
FIG. 5B is a sectional view of the chromium mask 1.

As shown in FIG. 5B, the chromium mask 1 includes a transparent substrate 22. A shield film 21 is provided on a part of the transparent substrate 22 that corresponds to the shield region 11. The shield film 21 reflects the light applied to the chromium mask 1 in the exposure process, not allowing the light to pass through the chromium mask 1. No shield film is provided on the first transparent region 12. Hence, the first transparent region 12 allows passage of the light.

Figure 5C:
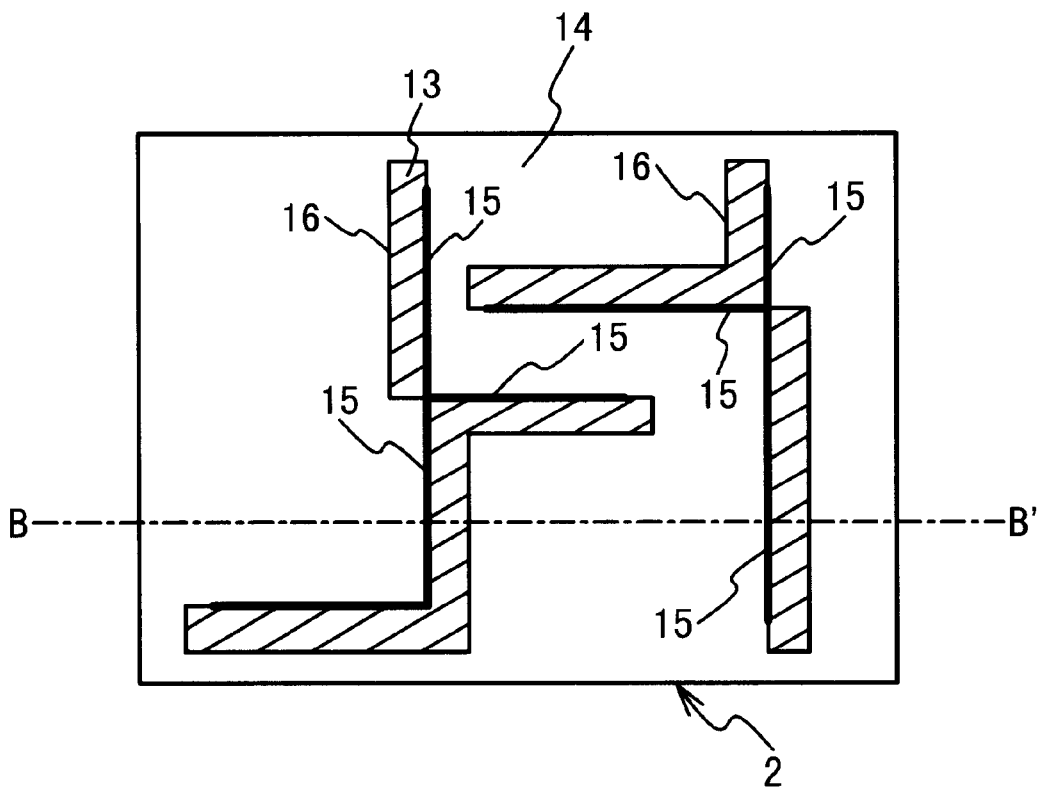
FIG. 5C is a plan view of a chromium-less phase shift mask 2 used in the second exposure step of the exposure method according to the invention.
Figure 5D:
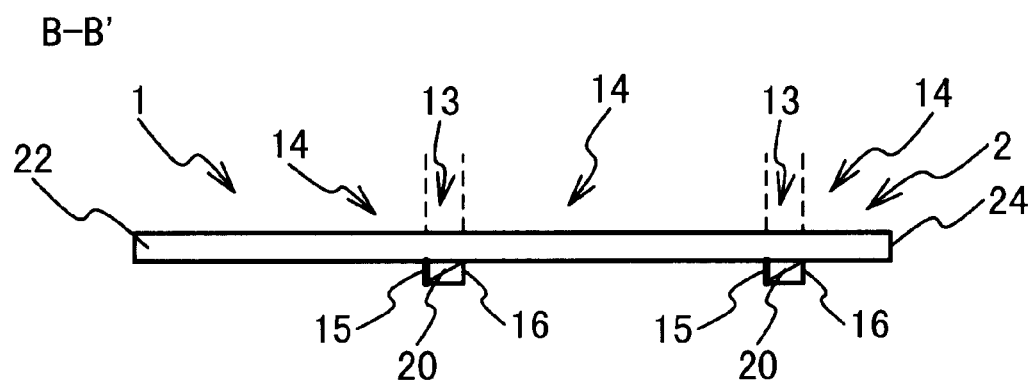
FIG. 5D is a sectional view of the chromium-less phase shift mask 2.

As shown in FIG. 5C, the chromium-less phase shift mask 2 has a second transparent region 13 and a third transparent region 14. In the second transparent region 13, a phase shifter 20 is formed on the transparent substrate 24 as is illustrated in FIG. 5D. In the third transparent region 14, no phase shifters are provided on the transparent substrate 24. The phase shifter 20 shifts the phase of the beam passing through the second transparent region 13, with respect to the phase of the beam passing through the third transparent region 14. The phase shifter 20 has such a thickness d that the beam output from it differs in phase by 180° from the beam input to it. The thickness d is defined as follows:

$$d=\lambda/\{2\times(n-1)\}. \quad (3)$$

The second transparent region 13 has a phase shifter edge 16. The phase shifter edge 16 is a boundary between the second transparent region 13 and the third transparent region 14.

The region near the phase shifter edge 16 functions as a shield section. The beams passing through the second transparent region 13 and third transparent region 14, respectively, are out of phase with respect to each other. The intensity of light is therefore almost nil at position on a resist layer, where the image of the phase shift edge 16 is formed. The chromium-less phase shift mask 2 substantially has a shield region, though no shield films are provided on it.

Figure 6A:
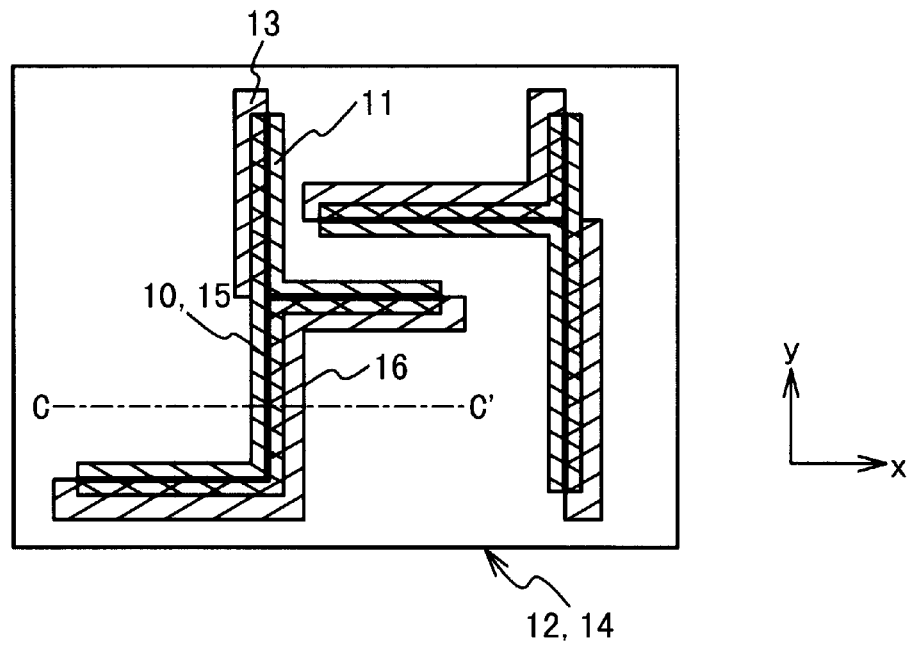
FIG. 6A shows a layout of patterns obtained when the masks 1 and 2 are laid one upon the other.

FIG. 6A shows a layout of patterns obtained when the chromium mask 1 and the chromium-less phase shift mask 2 are laid one upon the other. The phase shifter edge 16 has a part 15 aligning with the centerline 10 of the shield region 11 of the chromium mask 1. When the masks 1 and 2 are laid one upon the other as shown in FIG. 6A, the centerline 10 of the shield region 11 overlaps the part 15 of the phase shifter edge 16 of the second transparent region 13 shown in FIG. 5B. In FIGS. 5A and 6A, the part 15 of the phase shifter edge 16 is indicated in thick line. The thick line does not mean that the boundary line is thick in part.

When exposure is carried out using the chromium-less phase shift mask 2, the part of the resist layer which is near the part on which the phase shifter edge 16 is projected will not be exposed to light. That is, a resist pattern may be formed near the part on which the phase shifter edge 16 is projected. However, no resist patterns will be formed in that part of the resist layer which is exposed to light through the chromium mask 1 in the first exposure step. In the exposure method of this invention, a resist pattern is formed in only a part of the resist layer which is near the position where the phase shifter edge 16 of the second transparent region 12 is projected, and is also covered with the shield region 11.

Figure 6B:
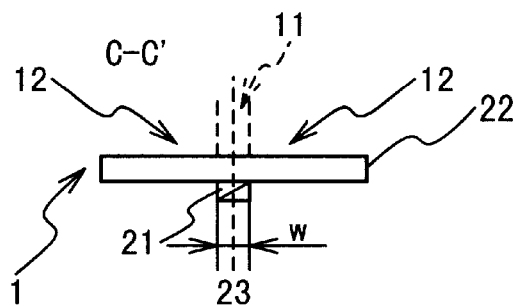
FIG. 6B is a sectional view of the chromium mask 1.
Figure 6C:
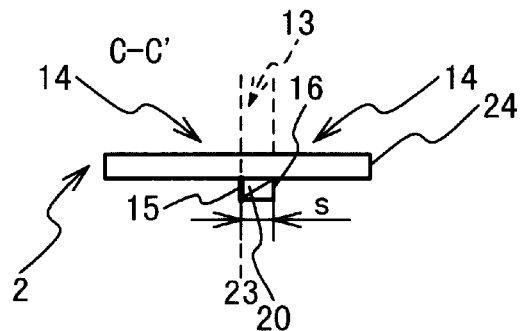
FIG. 6C is a sectional view of the chromium-less phase shift mask 2.

As shown in FIGS. 6A to 6C, the width of the second transparent region 13, that is, the distance s between the phase shifter edges 16, is greater than the width w of the shield region 11 of the chromium mask 1. The distance is one between the opposing edges of the second transparent region 13 that defines the phase shifter edges 16. The fact that the distance s is greater than the width w helps to enhance the resolution of the image focused on the resist, as will be described later.

Figure 12:
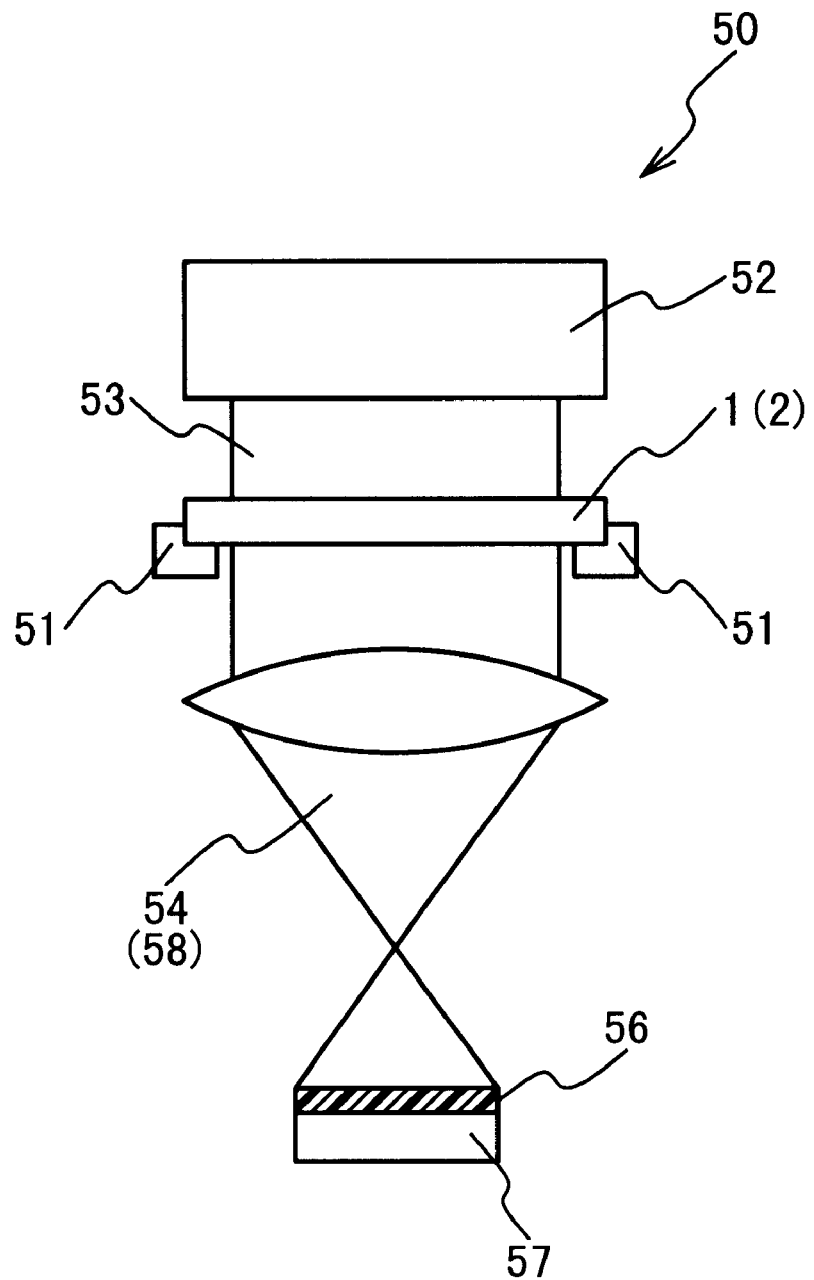
FIG. 12 shows the reducing projection exposure apparatus that is used to perform the exposure method according to the present invention.

The exposure method according to the present embodiment will now be described in detail. At first, the first exposure step is carried out, using the chromium mask 1 shown in FIG. 5A. FIG. 12 illustrates a reducing projection exposure apparatus 50 that is used to perform the exposure method. The apparatus 50 effects the first exposure step. In the first exposure step, the chromium mask 1 is secured to the mask holder 51 of the reducing projection exposure apparatus 50. The KrF excimer laser 52 provided in the apparatus 50 emits a laser beam 53. The wavelength of the laser beam 53 is 248 nm. The laser beam 53,is applied at right angles to the chromium mask 1. As shown in FIG. 6B, the shield film 21 reflects the laser beam 53 thus applied. The laser beam 53 cannot pass through the shield region 11 and passes through the first transparent region 12 only. The laser beam 54 emerging from the first transparent region 12 passes through the projection lens 55 of the reducing projection exposure apparatus. The laser beam 54 is applied to the positive-type resist 56 provided on a semiconductor substrate 57.

Figure 6D:
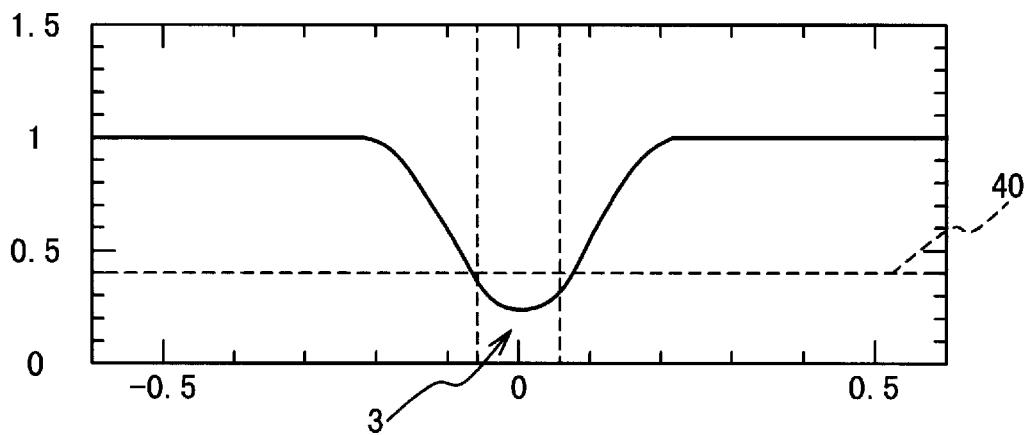
FIG. 6D represents the intensity distribution of a laser beam 54 applied to a positive-type resist 56 in the first exposure step.

FIG. 6D shows the intensity distribution of the laser beam 54 at the position on the positive-type resist 56, where the line C–C' is projected as shown in FIG. 6A. In FIG. 6D, the origin, at which x=0, coincides with the position where the centerline 10 of the shield region 11 is projected at the surface of the positive-type resist 56. That is, the origin coincides with the position where the part 15 of the phase shifter edge 16 is projected at the surface of the positive-type resist 56. On the surface of the positive-type resist 56, the width w of the shield film 21 has such a value that a resist pattern may be formed, which is 120 nm (0.12 $\mu$m) wide along the x axis, i.e., the direction in which the image of the C–C' line extends. The NA value, that is, the numerical aperture of the projection lens 55 is 0.68.

The laser beam 54 applied to the to the positive-type resist 56 in the first exposure step has the intensity distribution illustrated in FIG. 6D. As shown in FIG. 6D, the beam 54 is least intense at a position where x=0. That is, the first dark section 3 is formed near that position where x=0. The broken line 40 in FIG. 6D represents the lower limit to the intensity of light that the positive-type resist 56 responds to. The resist 56 is dissolved at any part that has been irradiated with a laser beam having intensity higher than the intensity represented by the broken line 40. The intensity corresponding to the broken line 40 varies with the conditions of the exposure process.

Then, the second exposure step is performed, using the chromium-less phase shift mask 2. As shown in FIG. 12, the chromium mask 1 is removed from the mask holder 51 and the chromium-less phase shift mask 2 is secured to the mask holder 51. A laser beam 53 is applied to the chromium-less phase shift mask 2, at right angles as in the first exposure step. The laser beam 53 passes through both the second transparent region 13 and the third transparent region 14 as is illustrated in FIG. 6C. As described above, the phase shifter has the thickness d defined by the equation (3). Hence, the phase shifter 20 imparts a phase difference of 180° to the two laser beams emerging from the second transparent region 13 and the third transparent region 14. The laser beam 58 which passed through the second transparent region 13 and the third transparent region 14 passes through the projection lens 55 and is applied to the positive-type resist 56.

Figure 6E:
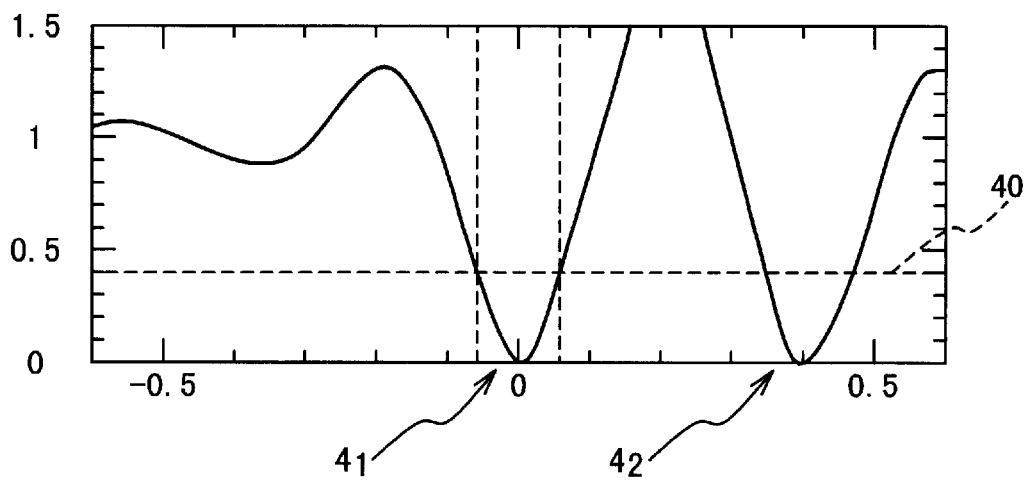
FIG. 6E depicts the intensity distribution of a laser beam 58 applied to a positive-type resist 56 in the second exposure step.

The laser beams 58 applied to the resist 56 in the second exposure step have the intensity distribution of FIG. 6E at the position on the positive-type resist 56, where the line C–C' is projected as shown in FIG. 6A. In FIG. 6E, the origin (x=0) is identical to the origin of the graph (FIG. 6D) that represents the light-intensity distribution observed in the first exposure step. The phase shifter 20 has such a width that the image of the phase shift edge 16 is projected on the positive-type resist 56, at a distance of 0.4 $\mu$m in the x axis. The incoherence ratio σ, or the incoherence of the beam emitted from the KrF excimer laser 52, is 0.3. It is desired that the incoherence ratio σ be as small as possible in the second exposure step.

In the second exposure step, the laser beam 58 applied to the positive-type resist 56 has least intense at two positions, x=0 ($\mu$m) and x=0.4 ($\mu$m), as shown in FIG. 6E. That is, the beam is most weak at two positions where the image of the phase shift edge 16 is projected on the resist 56. Two second dark sections $4_1$ and $4_2$ are formed, respectively, near that position where x=0 ($\mu$m) and near the position where x=0.4 ($\mu$m).

The second transparent region 13 and the third transparent region 14, through which two beams output of phase pass, sharply change the light-intensity distribution at a position which is close to the position where the image of the phase shift edge 16 is projected on the positive-type resist 56. The intensities of the laser beams 58 much change at the boundary of the second dark sections $4_1$ and $4_2$. This means that the widths of both dark sections $4_1$ and $4_2$ can be decreased.

Figure 6F:
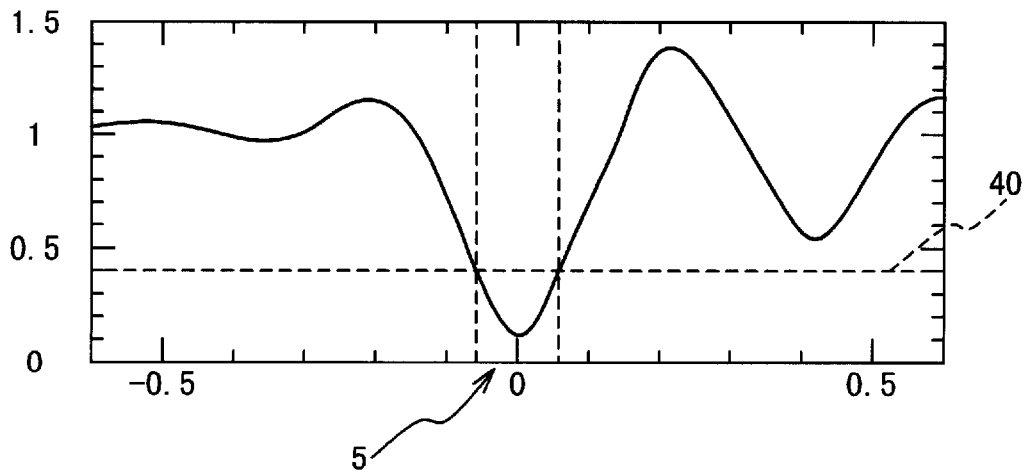
FIG. 6F represents half the total distribution of the light beams applied to the positive-type resist 56 in the first and second exposure steps.

FIG. 6F represents half the total distribution of the light beams applied to the positive-type resist 56 in the first and second exposure steps. As FIG. 6F shows, a third dark section 5 is formed on the positive-type resist 56. The third dark section 5 is located near a position that corresponds to the origin (x=0) of the graph (FIG. 6F). That is, the third dark section 5 is formed at a position where the first dark section 3 and one of the second dark sections $4_1$ overlap each other. Namely, the third dark section 5 is provided at the position where a pattern is to be formed.

Also, no resist patterns should not be formed at the position where the other second dark section 42 is provided. However, no resist patterns will be formed at the position where the other second dark section 42 is provided. This is because a light beam having more intense than is represented by the broken line 40 is applied at the position where the other second dark section $4_2$ is provided in the first exposure step.

Thus, the phase shift exposure technique according to the present embodiment can be utilized to form two-dimensional random patterns.

In the second exposure step, the distance s between the phase shifter edges 16 is desirably greater than the width w of the shield region 11 of the chromium mask 1. This results in that the phase shifter edges 16 of the phase shifter 20 reliably function as shield sections. The shorter the distance s between the edges 16, the shorter the distance between the two dark sections formed in the second exposure step. If the distance s is too short, no dark sections will be formed on the positive-type resist 56. Hence, it is required that the distance s between the phase shifter edges be sufficiently long. The distance s greater than the width w of the shield region 11 enhances the resolution of the image focused on the positive-type resist 56. In addition, two-dimensional random patterns can be formed in high dimensional precision on the positive-type resist 56.

Figure 7:
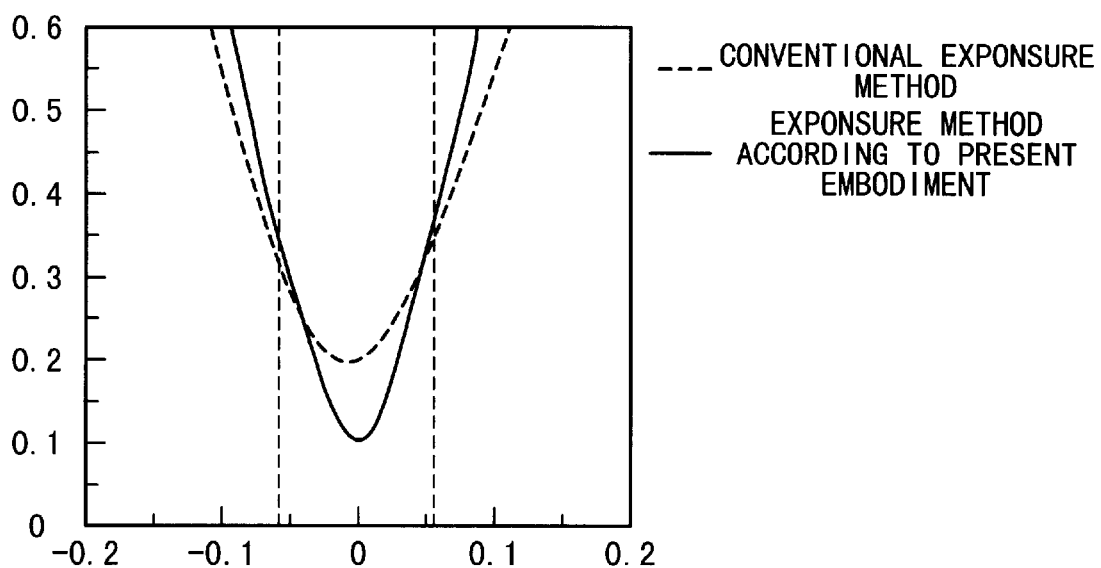
FIG. 7 shows the intensity distribution of light applied to a resist in the exposure method of the invention and the intensity distribution of light applied to a resist in the conventional exposure method.
Figure 8A:
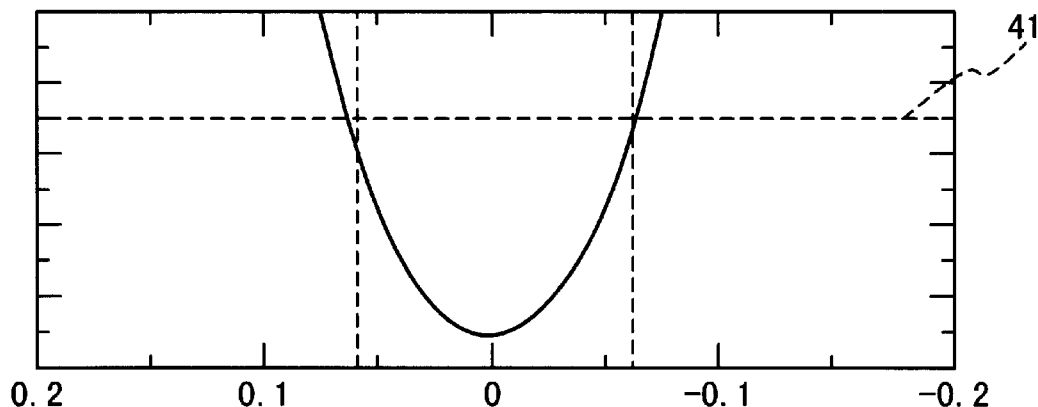
FIGS. 8A to 8F are diagrams showing the defocus-dependency of the intensity distribution of light applied to a resist, which is observed in the exposure method according to the invention.
Figure 8B:
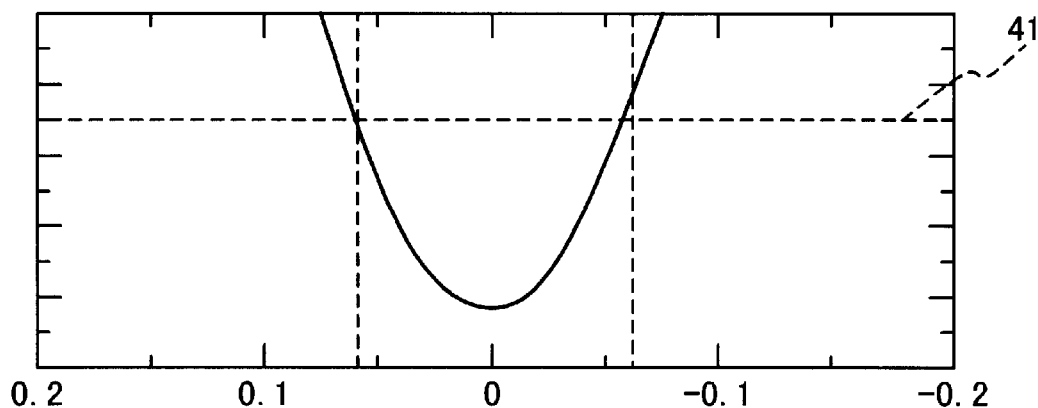
Figure 8C:
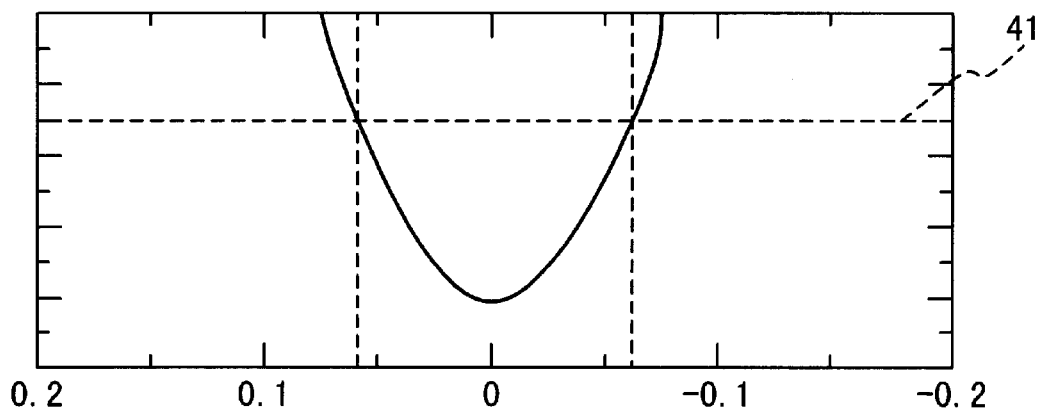
Figure 8D:
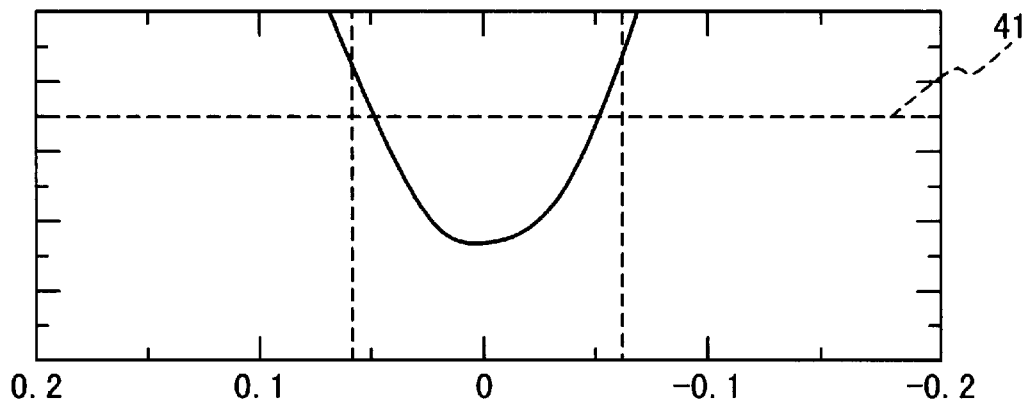
Figure 8E:
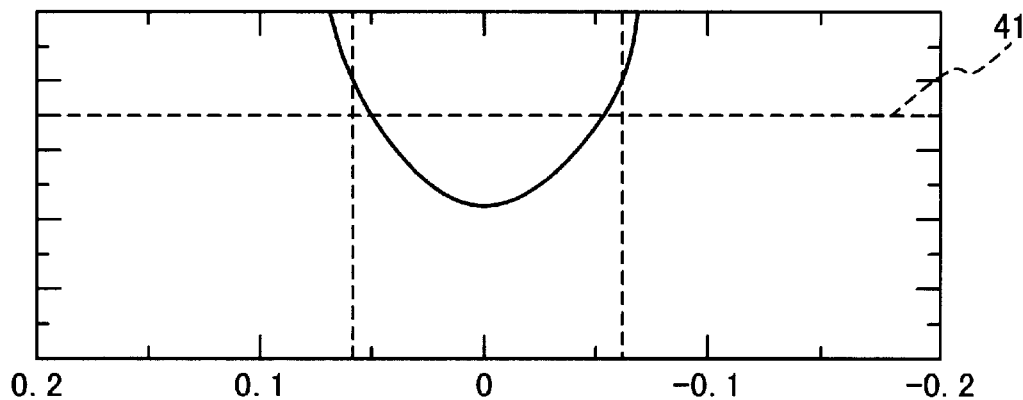
Figure 8F:
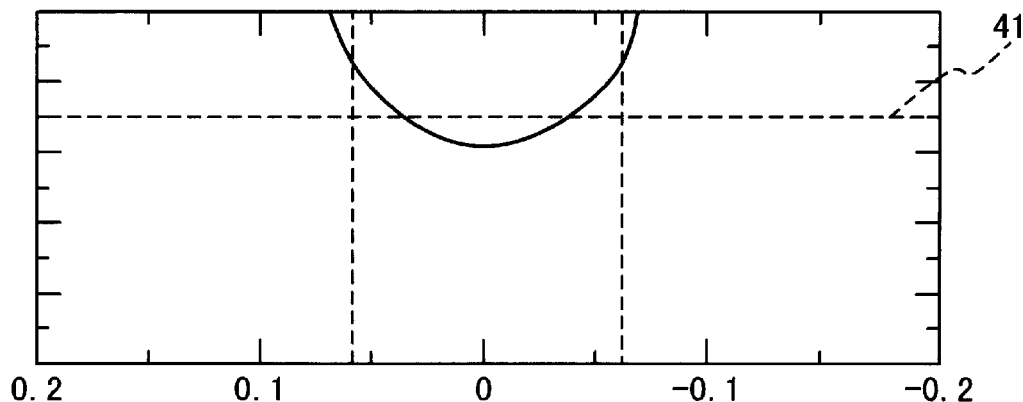
Figure 9A:
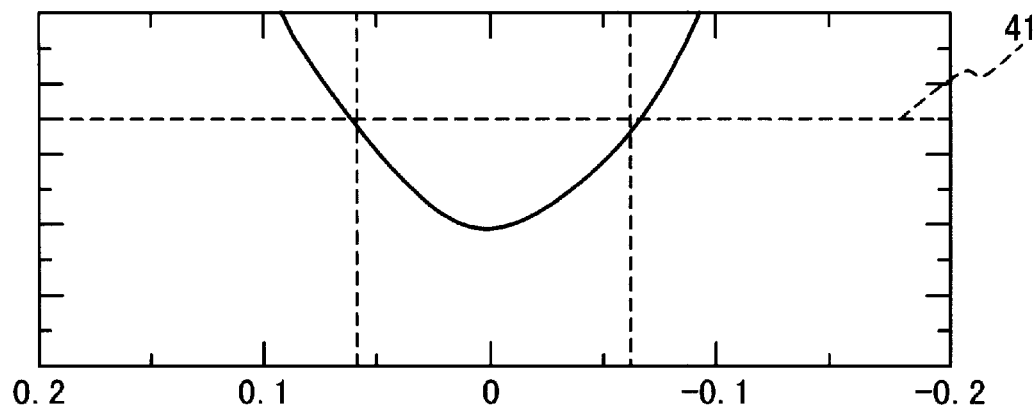
FIGS. 9A to 9F are diagrams showing the defocus-dependency of the intensity distribution of light applied to a resist, which is observed in the conventional exposure method.
Figure 9B:
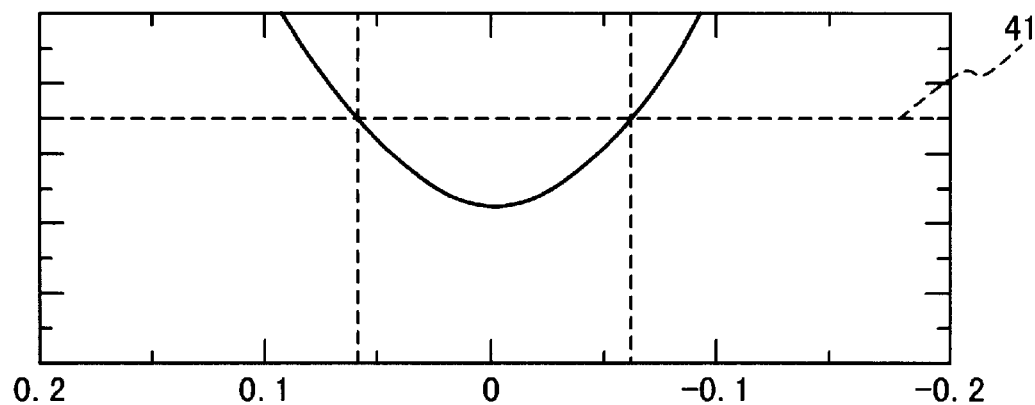
Figure 9C:
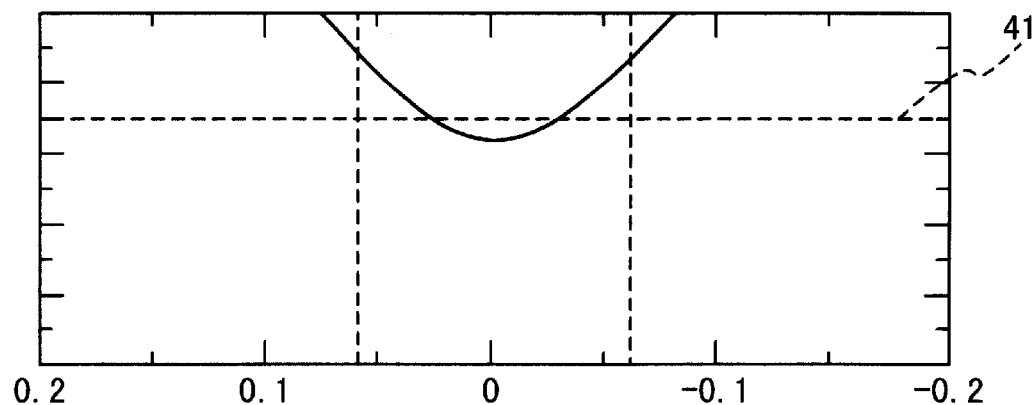
Figure 9D:
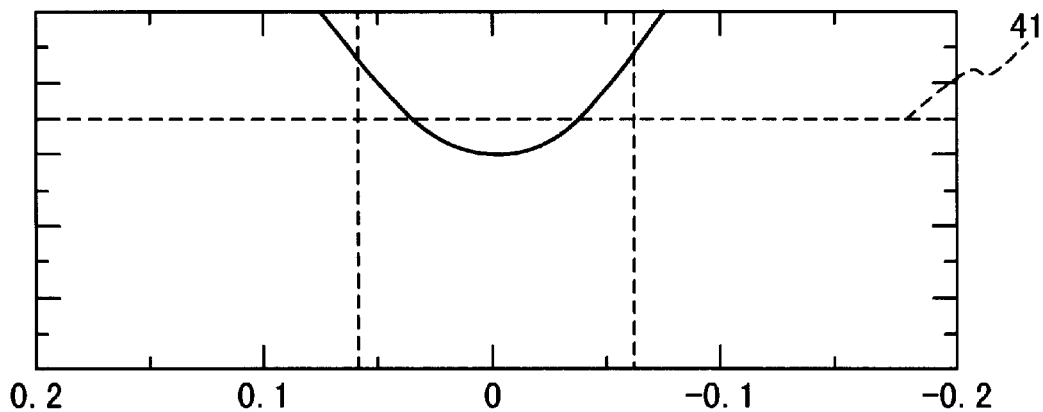
Figure 9E:
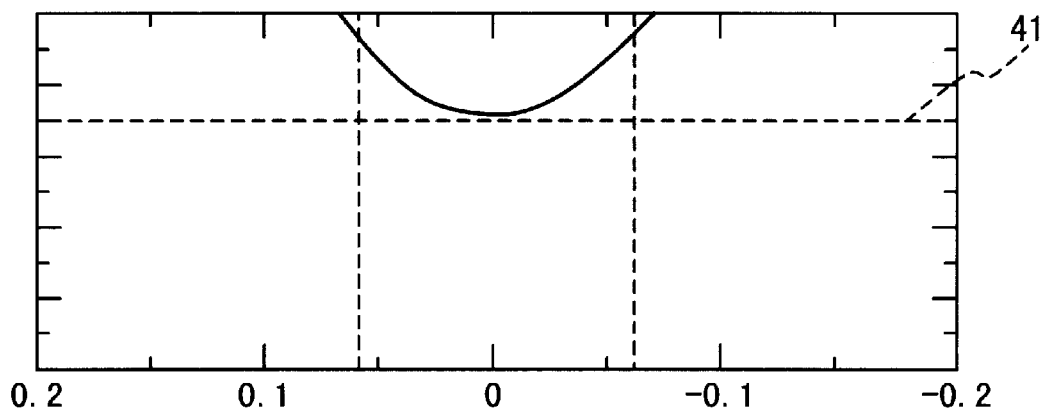
Figure 9F:
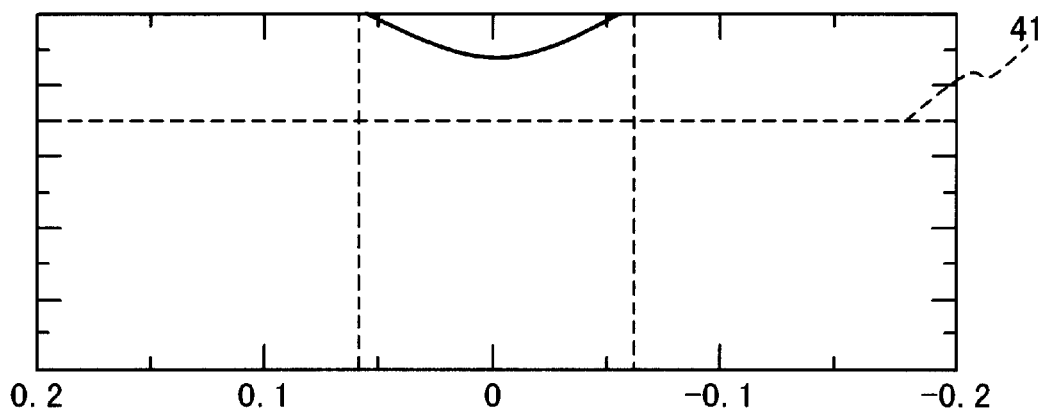

The exposure method according to the present embodiment can form images on the positive-type resist 56 at higher resolution than is possible with the conventional exposure method. FIG. 7 is a magnified representation of that part of FIG. 6F which shows the light-intensity distribution (solid line) at the third dark section 5, and illustrates the light-intensity distribution (broken lines) observed in the conventional exposure method using a chromium mask 1 only. The exposure method of the invention increases the contrast about twice the value achieved by the conventional exposure method. The word "contrast" used here is concerned with the light applied to the positive-type resist. It means the ratio of the most intense part of the beam to the least intense part thereof in terms of brightness.

Moreover, the exposure method of the invention can increase the depth of focus more than is possible with the conventional exposure method described above. FIGS. 8A to 8F are diagrams showing the defocus-dependency of light-intensity distribution, which is observed in the exposure method according to the invention. FIGS. 9A to 9F are diagrams illustrating the defocus-dependency of light-intensity distribution, which is observed in the conventional exposure method. "Defocus" here represents a difference in vertical directions from the surface of the resist whose focal position is the image field. As seen from FIGS. 8A to 8F and FIGS. 9A to 9F, the depth of focus achieved in the method of the invention is greater than that obtained in the conventional method. Thanks to the great depth of focus, two-dimensional random patterns can be formed on the resist in the exposure method according to the present invention.

In the exposure method described above, more light is desirably applied to the resist in the second exposure step than in the first exposure step. The light-intensity distribution in the second exposure step using the phase shift mask is sharper than the light-intensity distribution in the first exposure step using no phase shift masks. It is desired that light be applied to a part (x=0) of the resist, where a resist pattern will be formed, mainly in the second exposure step. When more light is applied to the resist in the second exposure step than in the first exposure step, the ratio of light applied in the second exposure step to the light applied in the first exposure is greater. This further enhances the resolution of the image focused at the surface of the resist and ultimately increases the dimensional precision of the two-dimensional random patterns formed on the resist. In the first exposure step, on the other hand, it suffices to apply a smaller amount of light to the second dark section $4_2$ of the resist. This is because no pattern needs be formed on the second dark section $4_2$.

The phase shifter edge 16 provided at the second transparent region 13 of the chromium-less phase shift mask 2 can achieve the object of the present invention, only if the overlapping parts of the chromium mask 1 and the phase shift mask 2 lie over the shield region 11. A resist pattern is formed on only that part of the resist which is near the image of the phase shift edge 16 of the second transparent region 12 projected on the resist and which is protected by the shield region 11. It is, however, desired that all centerline 10 of the shield region 11 should align with the phase shifter edge 16 provided at the second transparent region 13. If the centerline 10 aligns with the phase shifter edge 16, the least intense point in the distribution of the laser beam applied in the first exposure step coincides with the least intense point in the light distribution of the laser beam applied in the second exposure step. This enhances the resolution of any pattern formed on the resist.

Figure 10:
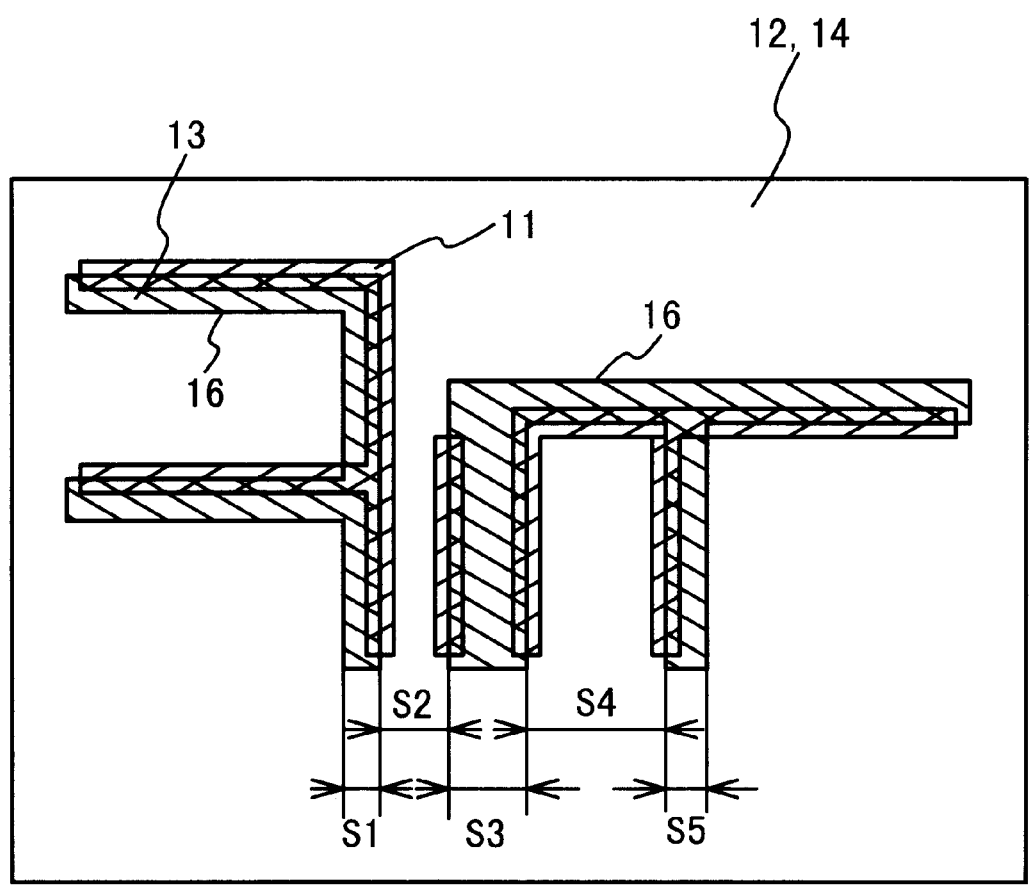
FIG. 10 is a plan view depicting another type of a chromium mask and another type of a chromium-less phase shift mask.

The chromium mask 1 and chromium-less phase shift mask 2, shown in FIG. 5A and FIG. 5B, respectively, are nothing more than examples. The chromium mask and chromium-less mask that are shown in FIG. 10 may replace them. FIG. 10 is a plan view depicting the alternative chromium mask and chromium-less phase shift mask, which overlap each other. As shown in FIG. 10, the distance s3 between the phase shifter edges of the chromium-less phase shift mask is equal to the distance between shield regions. The term "distance between shield regions" means the distance between the centerlines of any two opposing shield regions. Like the chromium-less phase shift mask 2 described above, the chromium-less phase shift mask shown in FIG. 10 has phase shifter edges spaced apart by distances (s1, s2, s4, s5) which are longer than the width of the shield region 11 of the chromium mask.

Also, the two beams that have passed through the second and third transparent regions 13 and 14, respectively, are allowed to have a phase difference that deviates a little from the desired value of 180°. The experiments the inventor hereof conducted reveal that the light-intensity distributions of the beams applied to the resist in the first and second exposure steps have a desirable contrast so long as the phase difference falls within the range of 175° to 185°.

Figure 11:
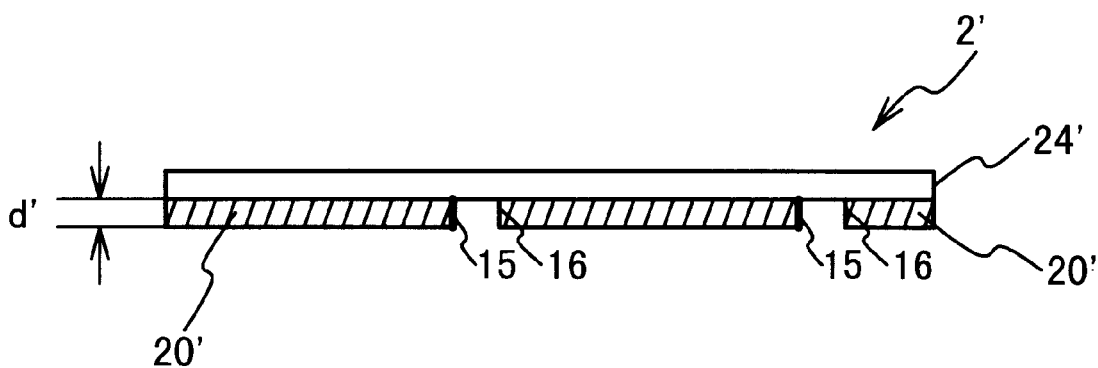
FIG. 11 is a sectional view of a chromium-less phase shift mask 2' designed for printing patterns on substrates.

FIG. 11 shows a chromium-less phase shift mask 2' designed for printing patterns on substrates. The mask 2' may be used in place of the chromium-less phase shift film 2. The chromium-less phase shift mask 2' has a transparent substrate 24'. The transparent substrate 24' has a phase shifter 20' that has been etched to a depth d'. The depth d' is given as follows:

$$d'=l/\{2\times(n'-1)\}, \tag{3'}$$

where n' is the refractive index of the transparent substrate 24'.

In the exposure method described above, it is possible to use the chromium-less phase shift mask in the first exposure step and the chromium mask in the second exposure step.

As has been described above, the exposure method according to the present invention comprises the first exposure step and the second exposure step. A photo-mask having a two-dimensional random pattern is used in the first exposure step. A phase shift mask having a phase shift edge pattern is used in the second exposure step. With the exposure method of the invention, it is possible to form two-dimensional random patterns by the use of phase shift exposure technique. The exposure method of the invention can therefore enhance the resolution of images focused on a resist. Moreover, the exposure method of the invention can form, on resists, two-dimensional random patterns of high dimensional precision.

Although the invention has been described in its preferred form with a certain degree of particularity, it is understood that the present disclosure of the preferred form has been changed in the details of construction and the combination and arrangement of parts may be resorted to without departing from the spirit and scope of the invention as hereinafter claimed.

What is claimed is:

1. A method of forming a photoresist pattern by a photolithography technique comprising:

providing a photoresist layer;

exposing said photoresist layer to a first pattern-defining light using a first mask including a shielding region shielding said first pattern-defining light; and exposing said photoresist layer to a second pattern-defining light using a second mask including:

a phase-shifting region having a phase shifter edge, wherein a first light portion of said second pattern-defining light passes through said phase-shifting region, and a non-phase-shifting region adjacent to said phase-shifting region on said phase shifter edge, wherein a second light portion of said second pattern-defining light passes through said non-phase-shifting region, and a first phase of said first light portion differs from a second phase of said second light portion, and wherein said first and second masks are aligned such that said phase shifter edge overlaps on said shielding region.

2. A method according to claim 1, wherein said shield region comprises a line resist shielding portion to form a line resist pattern extending to a first direction, and said line shielding portion has a centerline extending to said direction, and wherein said phase shifter edge substantially overlaps on said centerline when said first and second mask are aligned.

3. A method according to claim 2, wherein said phase shifter edge comprises first and second phase shifter edges parallel to each other and extending to said first direction, and wherein a distance between said first and second phase shifter edges is larger than a width of said line shielding portion in a second direction perpendicular to said first direction.

4. A method according to claim 1, wherein said phase-shifting region is provided with a phase-shifter layer, and a thickness of said phase-shifter layer is determined such that a phase difference between said first phase and said second phase ranges from 175 to 185°.

5. A method according to claim 1, wherein said phase shifter edge comprises first and second phase shifter edges parallel to each other and extending to a first direction, wherein said shield region comprises a line shielding portion for forming a line resist pattern, and extending to said first direction, and wherein a distance between said first and second phase shifter edges is larger than a width of said line shielding portion in a second direction perpendicular to said first direction.

6. A method according to claim 1, wherein said first pattern-defining light has a first intensity and said second pattern-defining light has a second intensity, and wherein said second intensity is larger than said first intensity.

* * * * *